US010998428B2

(12) United States Patent
Chang et al.

(10) Patent No.: US 10,998,428 B2
(45) Date of Patent: May 4, 2021

(54) INTEGRATED CIRCUIT DEVICE FINS

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Wei-Chiang Hung, Changhua County (TW); Wei-Hao Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 87 days.

(21) Appl. No.: 16/550,743

(22) Filed: Aug. 26, 2019

(65) Prior Publication Data
US 2020/0013881 A1 Jan. 9, 2020

Related U.S. Application Data

(62) Division of application No. 15/885,036, filed on Jan. 31, 2018, now Pat. No. 10,396,184.
(Continued)

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/02381* (2013.01); *H01L 21/02532* (2013.01);
(Continued)

(58) Field of Classification Search
CPC ......... H01L 21/02381; H01L 21/02532; H01L 21/02667; H01L 21/30625; H01L 21/3086;
(Continued)

(56) References Cited

U.S. PATENT DOCUMENTS 8,569,125 B2 * 10/2013 Standaert .............. H01L 29/785
438/197
8,753,940 B1 6/2014 Wei et al.
(Continued)

FOREIGN PATENT DOCUMENTS

KR 20170041515 4/2017
KR 20170053094 5/2017

*Primary Examiner* — Theresa T Doan
(74) *Attorney, Agent, or Firm* — Haynes and Boone, LLP

(57) ABSTRACT

Examples of an integrated circuit and a method for forming the integrated circuit are provided herein. In some examples, a method includes receiving a substrate that includes: a plurality of fins extending above a remainder of the substrate; a first region that includes a first fence region that contains a first subset of the plurality of fins; and a second region that includes a second fence region that contains a second subset of the plurality of fins. The first region has a first performance characteristic, and the second region has a second performance characteristic that is different from the first. Based on the first performance characteristic, the first subset of the plurality of fins is recessed to a first height, and based on the second performance characteristic, the second subset of the plurality of fins is recessed to a second height that is less than the first height.

20 Claims, 13 Drawing Sheets

Related U.S. Application Data

(60) Provisional application No. 62/586,398, filed on Nov. 15, 2017.

(51) Int. Cl.
| | | |
|---|---|---|
| *H01L 29/165* | (2006.01) | |
| *H01L 29/417* | (2006.01) | |
| *H01L 21/762* | (2006.01) | |
| *H01L 21/02* | (2006.01) | |
| *H01L 21/306* | (2006.01) | |
| *H01L 21/324* | (2006.01) | |
| *H01L 21/308* | (2006.01) | |
| *H01L 29/51* | (2006.01) | |
| *H01L 29/49* | (2006.01) | |

(52) U.S. Cl.
CPC .. *H01L 21/02579* (2013.01); *H01L 21/02667* (2013.01); *H01L 21/3086* (2013.01); *H01L 21/30625* (2013.01); *H01L 21/324* (2013.01); *H01L 21/76224* (2013.01); *H01L 29/165* (2013.01); *H01L 29/41791* (2013.01); *H01L 29/785* (2013.01); *H01L 29/7848* (2013.01); *H01L 29/4966* (2013.01); *H01L 29/513* (2013.01); *H01L 29/517* (2013.01)

(58) Field of Classification Search
CPC ............. H01L 21/324; H01L 21/76224; H01L 21/823431; H01L 27/0886; H01L 29/41791; H01L 29/4966; H01L 29/513; H01L 29/517; H01L 29/66795; H01L 29/7848; H01L 29/785
USPC ......................................................... 257/192
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2002/0167066 A1 | 11/2002 | Ueno et al. |
| 2013/0196478 A1* | 8/2013 | Chang ................ H01L 29/7853 438/283 |
| 2013/0309838 A1 | 11/2013 | Wei et al. |
| 2015/0147874 A1 | 5/2015 | Huang et al. |
| 2015/0340272 A1 | 11/2015 | Chen et al. |
| 2016/0308027 A1 | 10/2016 | Chang et al. |
| 2017/0092745 A1 | 3/2017 | Cheng et al. |
| 2017/0133264 A1 | 5/2017 | Kim et al. |
| 2017/0278715 A1 | 9/2017 | Cheng |
| 2018/0040703 A1 | 2/2018 | Chang et al. |
| 2019/0148520 A1 | 5/2019 | Chang et al. |

* cited by examiner

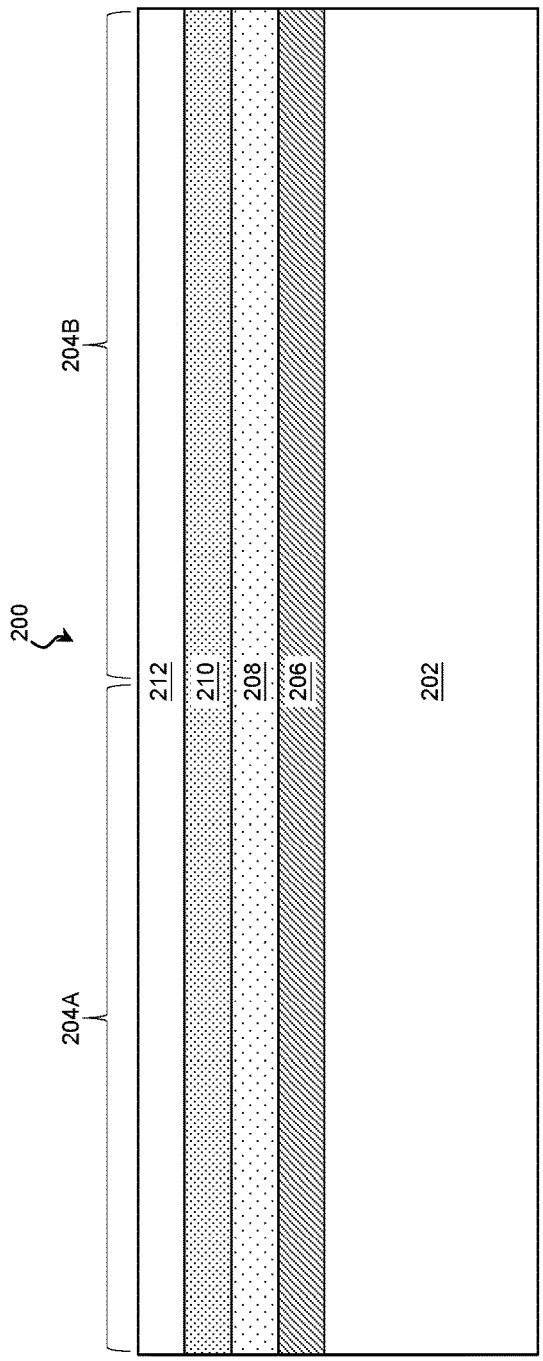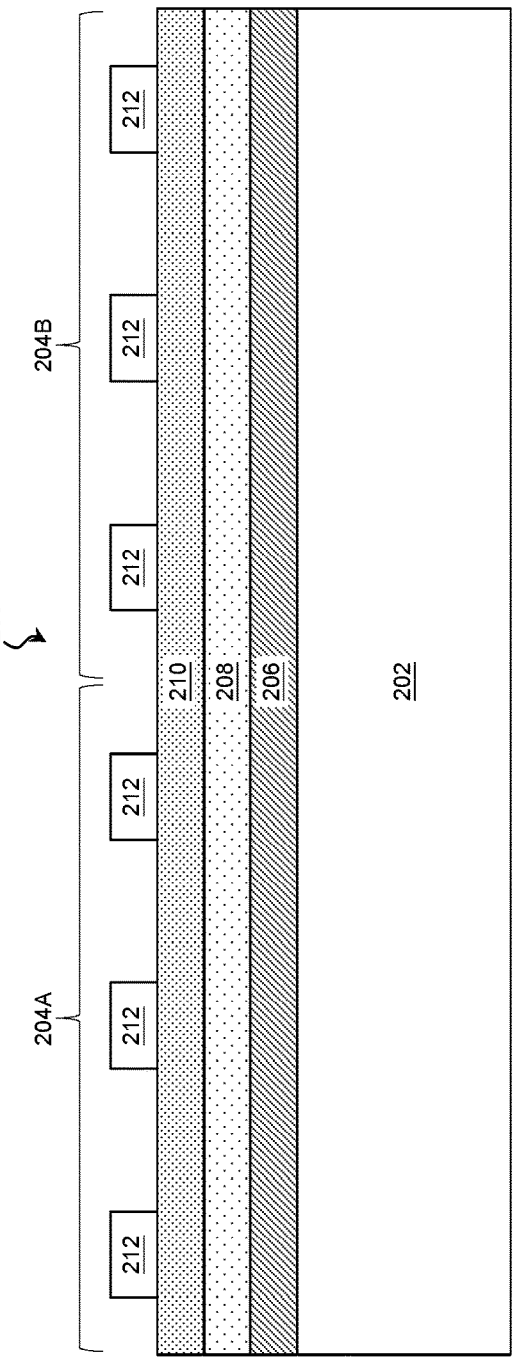

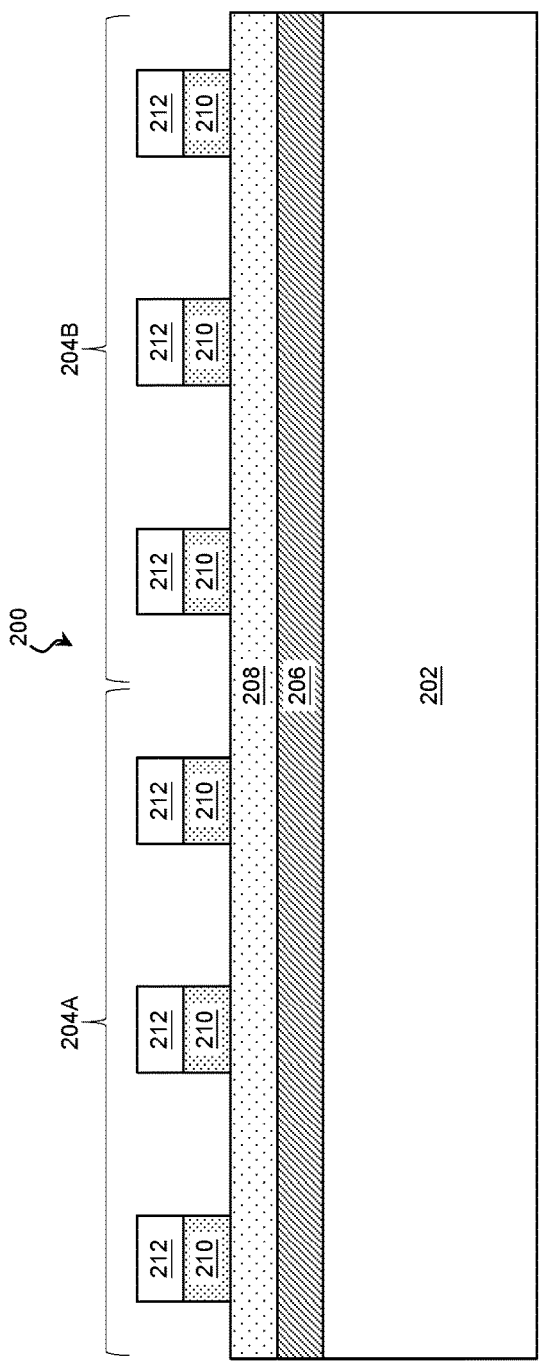
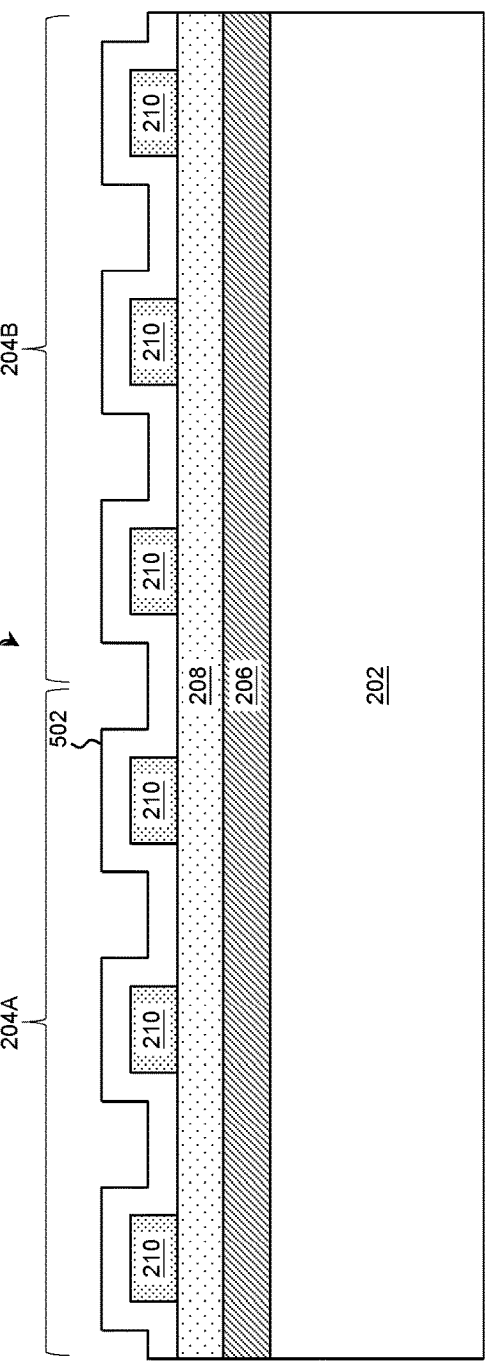

INTEGRATED CIRCUIT DEVICE FINS

PRIORITY DATA

The present application is a divisional application of U.S. patent application Ser. No. 15/885,036, entitled "Integrated Circuit Device Fins," filed Jan. 31, 2018, which claims the benefit of U.S. Provisional Application No. 62/586,398, entitled "Integrated Circuit Device Fins," filed Nov. 15, 2017, each of which are herein incorporated by reference in their entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, the advances in manufacturing have enabled the fabrication of three-dimensional designs, such as a Fin-like Field Effect Transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-20 are cross-sectional views of a workpiece along a channel region at various points in a method of fabrication according to embodiments of the present disclosure.

DETAILED DESCRIPTION

Figure 1A:
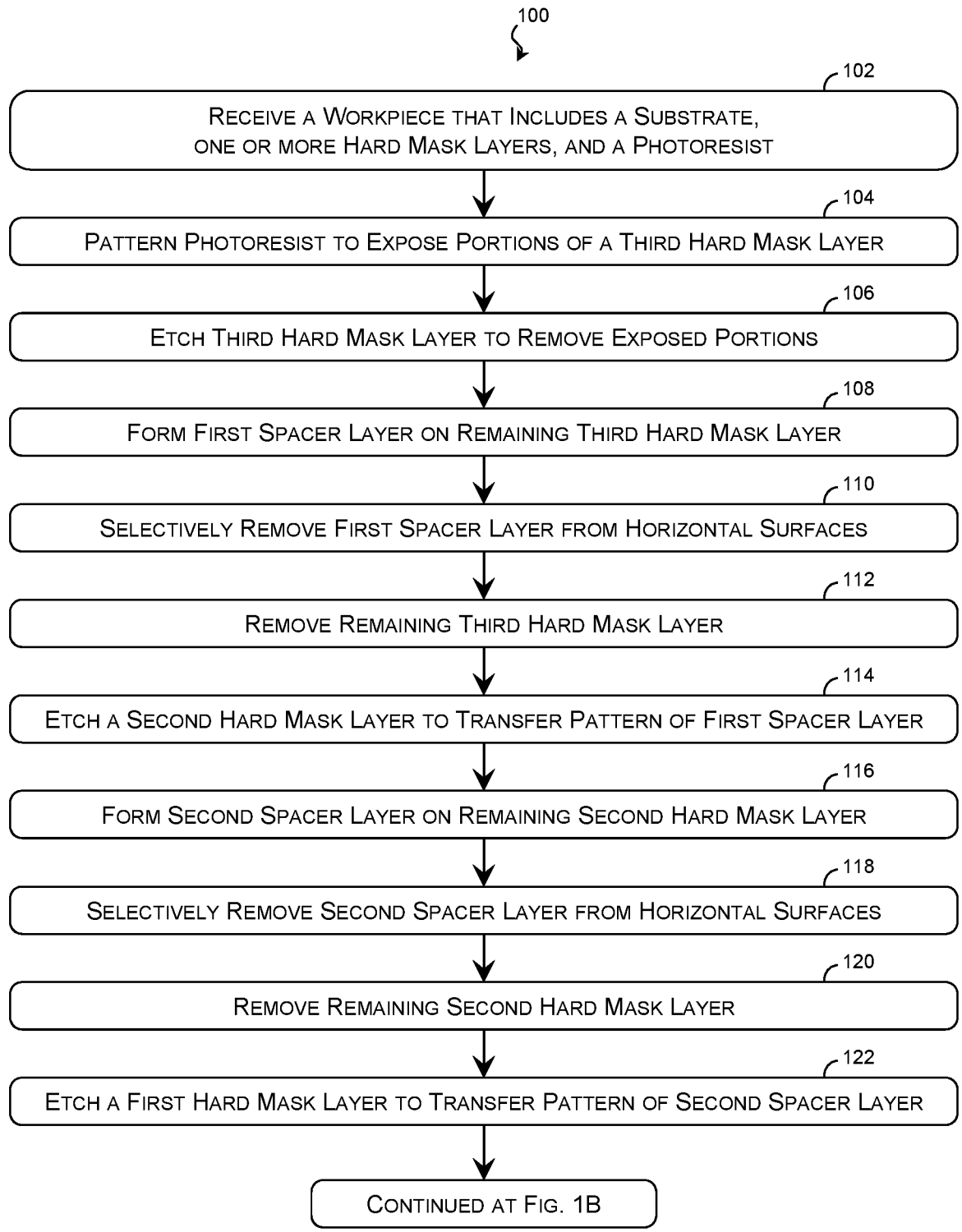
FIGS. 1A and 1B are flow diagrams of a method of fabricating a workpiece according to embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

An integrated circuit may include a number of different active and passive devices fabricated on a substrate. These integrated circuit devices may include planar devices and/or non-planar devices. A FinFET is an example of a non-planar device and is formed on a fin extending above the remainder of the substrate. An individual circuit may include millions or billions of FinFETs and other fin-based devices, and each device may have a set of electrical parameters (e.g., drive strength, threshold voltage, switching frequency, etc.) tuned to its particular role.

Some examples of the present disclosure provide sets of fins with varying structures for fabricating a number of fin-based devices with different electrical parameters. In one such example, some fins have a deeper trench between the fins. As the trenches between fins may be filled with a dielectric material to form isolation features, the deeper trenches may reduce leakage current for devices formed on the respective fins. These fins may be reserved for forming relatively higher power devices.

Some examples of the present disclosure provide different types of isolation regions surrounding the device-forming fins based on the nature of the fins and/or the devices to be formed thereupon. In one such example, the isolation regions include a guard ring region that is substantially free of fins and a fence region that contains some residual fins. The fins in the fence region may be shorter than the fins that are used to form circuit devices. In the example, a workpiece includes a first type of isolation region with a first type of fence region containing residual fins that extend above the guard ring to prevent thermal bending and other irregularities in adjacent functional fins. Such a fence region may be used in a portion of the workpiece that has a high device density. The workpiece also includes a second type of fence region containing residual fins that do not extend above the top surface of the guard ring. This deeper fence region may increase electrical isolation and reduce leakage. Such a fence region may be used in a portion of the workpiece that includes high-power devices. By providing fins and isolation regions tailored to the performance characteristics of the devices to be formed thereon, these examples may provide improved device performance and reliability. However, unless otherwise noted, no embodiment is required to provide any particular advantage.

Figure 1B:
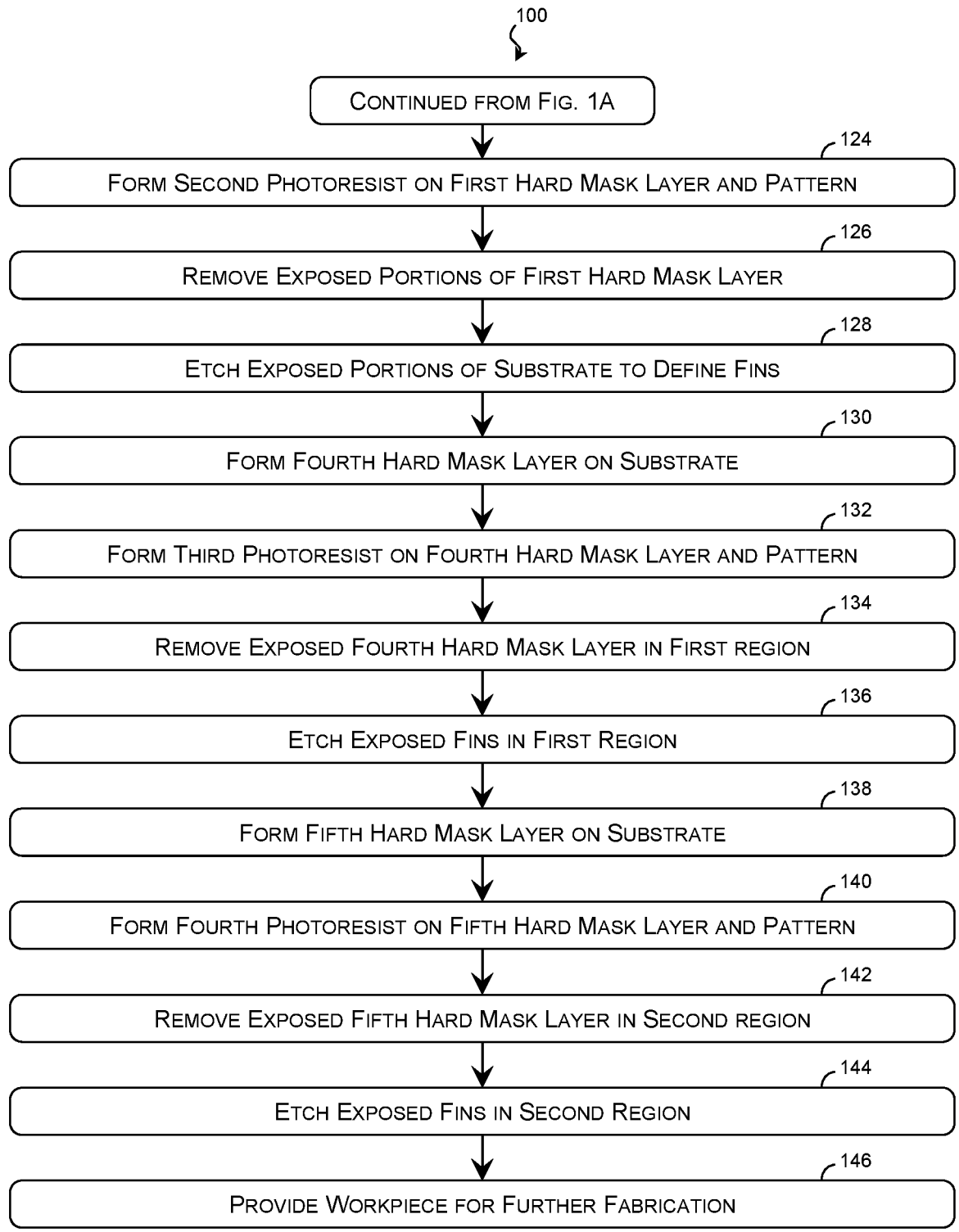
Figures 21A, 21B:
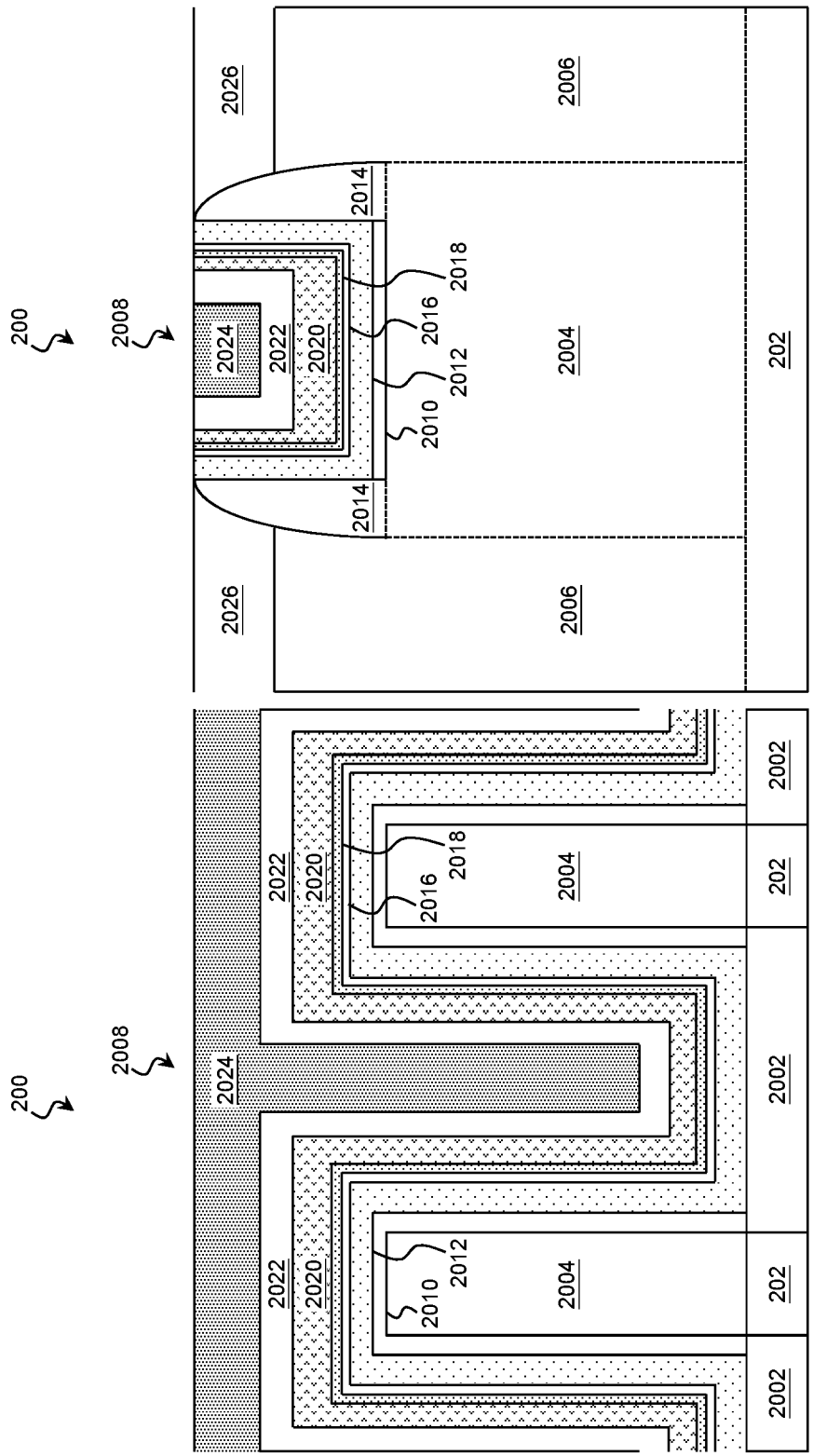
FIG. 21A is an enlarged cross-sectional view of a workpiece along a channel region according to embodiments of the present disclosure.
FIG. 21B is an enlarged cross-sectional view of a workpiece along a longitudinal length of a fin according to embodiments of the present disclosure.

The techniques of the present disclosure may be used to form a number of fins with varying structures for forming fin-based devices with different performance attributes to perform different roles in an integrated circuit. Examples of a FinFET and a method of forming such are described with reference to FIGS. 1A-21B. In that regard, FIGS. 1A and 1B are flow diagrams of a method 100 of fabricating a workpiece 200 according to embodiments of the present disclosure. Additional steps can be provided before, during, and after the method 100, and some of the steps described can be replaced or eliminated for other embodiments of the method 100. FIGS. 2-20 are cross-sectional views of the workpiece 200 along a channel region at various points in the method 100 according to embodiments of the present disclosure. FIG. 21A is an enlarged cross-sectional view of the workpiece 200 along a channel region according to embodiments of the present disclosure. FIG. 21B is an enlarged cross-sectional view of the workpiece 200 along a longitudinal length of a fin according to embodiments of the present disclosure. FIGS. 2-21B have been simplified for the sake of clarity and to better illustrate the concepts of the present disclosure. Additional features may be incorporated into the workpiece 200, and some of the features described below may be replaced or eliminated for other embodiments of the workpiece 200.

Referring to block 102 of FIG. 1A and to FIG. 2, the workpiece 200 is received. The workpiece 200 includes a substrate 202 upon which devices are to be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers. The layers may have similar or different compositions, and in various embodiments, some substrate layers have different compositions to induce device strain and thereby tune device performance. In one such example, the substrate 202 includes a bottommost layer that is predominantly Si and a layer of SiGe directly contacting the Si of the bottommost layer. The layer of SiGe may be processed to form active devices as described below, and differences in the crystalline lattice structures between Si and SiGe may impart a strain that affects the electrical properties of the devices.

Further examples of layered substrates include silicon-on-insulator (SOI) substrates 202. In some such examples, a layer of the substrate 202 may include an insulator such as a semiconductor oxide, a semiconductor nitride, a semiconductor oxynitride, a semiconductor carbide, and/or other suitable insulator materials.

In the examples of FIGS. 2-20, two regions (region 204A and region 204B) of the workpiece 200 are shown. The fabrication processes may be configured to create devices with different performance characteristics within the different regions. For example, region 204A may be designated for a higher device density, while region 204B may be designated for a lower device density and reduced leakage. In some examples, region 204A is designated for forming SRAM devices, while region 204B is designated for forming logic devices. In some examples, region 204A is designated for forming internal logic devices, and region 204B is designated for forming I/O devices.

In some examples, the devices to be formed on the substrate 202 extend out from the remainder of the substrate 202. For example, FinFETs and/or other non-planar devices may be formed on device fins that extend away from the remainder of the substrate 202. Fins formed in the following processes are representative of any raised feature and include FinFET device fins as well as fins for forming other raised active and passive devices upon the substrate 202. The fins may be formed by etching portions of the substrate 202, and the workpiece 200 may include any number of hard mask layers disposed upon the substrate 202 that may be used in the formation of the fins.

In the illustrated examples, the received workpiece 200 includes a first hard mask layer 206 disposed on the substrate 202, a second hard mask layer 208 disposed on the first hard mask layer 206, and a third hard mask layer 210 disposed on the second hard mask layer 208. Suitable materials for the hard mask layers 206, 208, and 210 include dielectrics (e.g., semiconductor oxides, semiconductor nitrides, semiconductor oxynitrides, semiconductor carbides, metal oxides, other metal compounds, etc.), metals, metal alloys, polysilicon, and/or other suitable materials. The materials may be selected so that each hard mask layer has a different composition and etchant sensitivity. For example, the first hard mask layer 206 may include silicon nitride, the second hard mask layer 208 may include silicon oxide, and the third hard mask layer 210 may include silicon carbide. The hard mask layers may be formed to any suitable thickness using any suitable process.

The received workpiece 200 may also include a photoresist 212 disposed on the hard mask layer(s). An exemplary photoresist 212 includes a photosensitive material that causes the photoresist 212 to undergo a property change when exposed to light. This property change can be used to selectively remove exposed or unexposed portions of the photoresist in a process referred to as lithographic patterning.

Referring to block 104 of FIG. 1A and to FIG. 3, the photoresist 212 is patterned to expose portions of the uppermost hard mask layer (e.g., third hard mask layer 210). In one such embodiment, a photolithographic system exposes the photoresist 212 to radiation in a particular pattern determined by a mask. Light passing through or reflecting off the mask strikes the photoresist 212 thereby transferring a pattern formed on the mask to the photoresist 212. In other such embodiments, the photoresist 212 is exposed using a direct write or maskless lithographic technique, such as laser patterning, e-beam patterning, and/or ion-beam patterning. Once exposed, the photoresist 212 is developed, leaving the exposed portions of the resist, or in alternative examples, leaving the unexposed portions of the resist. An exemplary patterning process includes soft baking of the photoresist 212, mask aligning, exposure, post-exposure baking, developing the photoresist 212, rinsing, and drying (e.g., hard baking). The patterned photoresist 212 exposes portions of the third hard mask layer 210 to be etched.

Referring to block 106 of FIG. 1A and to FIG. 4, an etching process is performed on the workpiece 200 to remove the exposed portions of the third hard mask layer 210. The etching processes may include any suitable etching technique such as wet etching, dry etching, Reactive Ion Etching (RIE), ashing, and/or other etching techniques. In some embodiments, the etching process includes anisotropic (directional) dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof. In some examples, the etchant is selected to etch the third hard mask layer 210 without significantly etching the second hard mask layer 208 or the photoresist 212. After etching the third hard mask layer 210, the photoresist 212 may be removed.

The etching defines mandrels in the remaining third hard mask layer 210 material. In some examples, the mandrels are used in a double-patterning, quadruple-patterning, or other multiple-patterning processes to form more than one shape from each mandrel. The examples of blocks 104-128 and FIGS. 1A-20 describe a quadruple-patterning process, although it is understood that the method 100 of the present disclosure may be used to perform other multiple-patterning processes by repeating or omitting certain steps.

Referring to block 108 of FIG. 1A and to FIG. 5, a first spacer layer 502 is formed on the mandrels of the third hard mask layer 210 and on the second hard mask layer 208. The first spacer layer 502 may include any suitable material (e.g., semiconductor, semiconductor oxide, semiconductor nitride, semiconductor oxynitride, semiconductor carbide, other suitable dielectric, etc.), and may be selected to have a different etchant selectivity than the second hard mask layer 208 and the third hard mask layer 210. In one such embodiment, the first spacer layer 502 includes silicon nitride. The first spacer layer 502 may be formed by any suitable process including Chemical Vapor Deposition (CVD), High-Density Plasma CVD (HDP-CVD), Atomic Layer Deposition (ALD), Physical Vapor Deposition (PVD), and/or other suitable deposition techniques. In some such embodiments, the first spacer layer 502 is deposited conformally by CVD or ALD.

Figure 6:
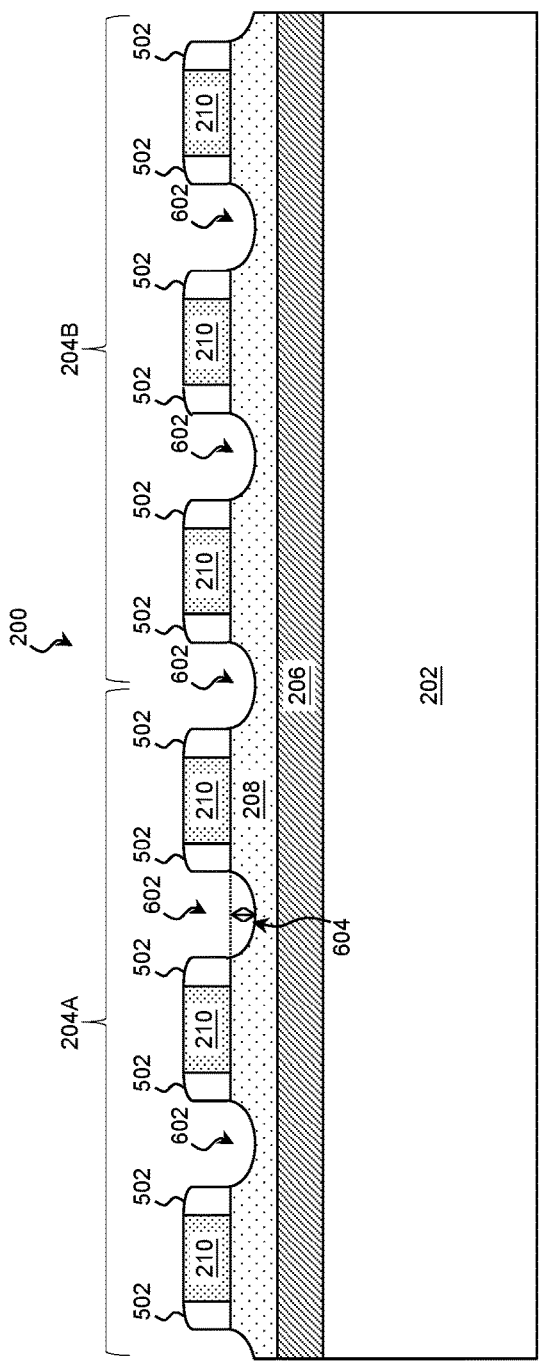

Referring to block 110 of FIG. 1A and to FIG. 6, an etching process is performed on the first spacer layer 502 to remove the first spacer layer 502 from horizontal surfaces of the third hard mask layer 210 and the second hard mask layer 208. The etching process may be performed using an anisotropic etching technique such as an anisotropic plasma etching or other suitable dry etching, wet etching, and/or RIE technique. As can be seen in FIG. 6, portions of the first spacer layer 502 (mandrels) remain on the vertical surfaces of the third hard mask layer 210.

The etching of the first spacer layer 502 may be configured to create a recess 602 in some portions of the second hard mask layer 208. The remainder of the first spacer layer 502 and the third hard mask layer 210 may protect other portions of the second hard mask layer 208 from etching. Various etching parameters including duration, temperature, etchant flow, RF field power, temperature, and/or other etching parameters may be tuned to control the depth of the recess 602. In various such examples, an etchant chemistry such as CxFyHz, HBr, $SF_6$, and/or $Cl_2$ is supplied along with ambient gasses such as $N_2$, $O_2$, He, and/or Ar at a pressure between about 5 mtorr and about 50 mtorr, at a temperature between about 10° C. and about 80° C., at a power between about 50 W and about 1500 W, and with a bias between about 0 W and about 1000 W.

Accordingly after the etching of block 110, the recess 602 may extend any suitable distance into the second hard mask layer 208, and in some examples, the recess 602 extends to a depth 604 of between about 1 Å and about 500 Å below a topmost surface of the second hard mask layer 208. In various such examples, the recess extends 602 between about 5% and about 50% through the second hard mask layer 208.

Figure 7:
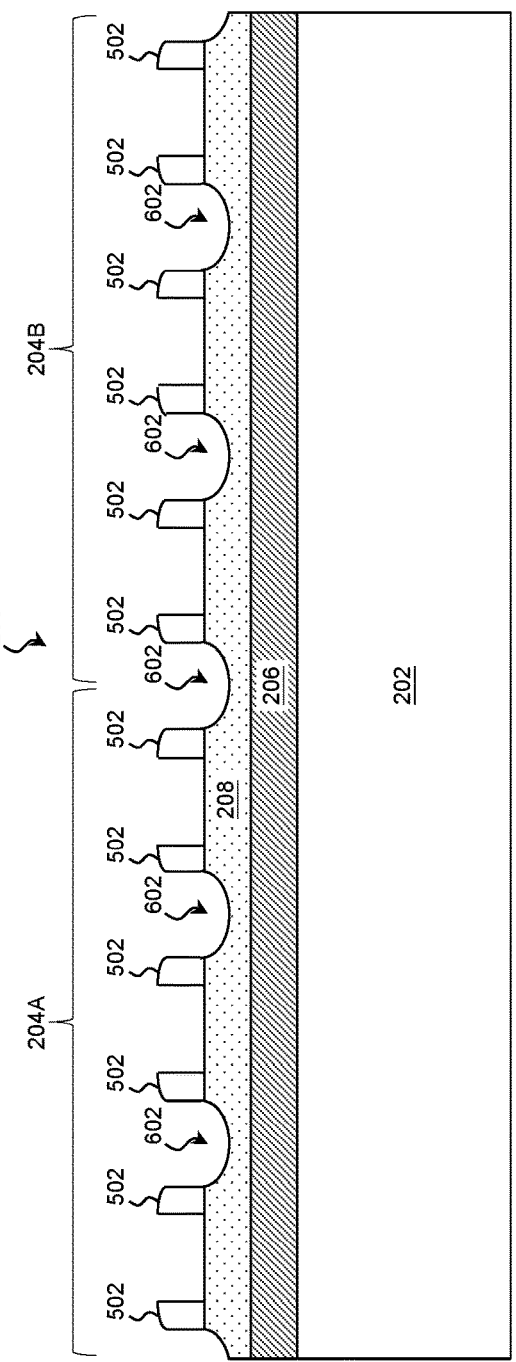

Referring to block 112 of FIG. 1A and to FIG. 7, an etching process is performed to remove the remainder of the third hard mask layer 210. The etching processes may include any suitable etching technique such as wet etching, dry etching, RIE, ashing, and/or other etching techniques. The etching process may use an etchant selected to avoid significant etching of the first spacer layer 502 and/or the second hard mask layer 208. Additionally or in the alternative, the etching technique is configured to create or extend the recess 602 within the exposed portions of second hard mask layer 208. Accordingly after the etching of block 112, the recess(es) 602 may extend any suitable depth 604 into the second hard mask layer 208.

Figure 8:
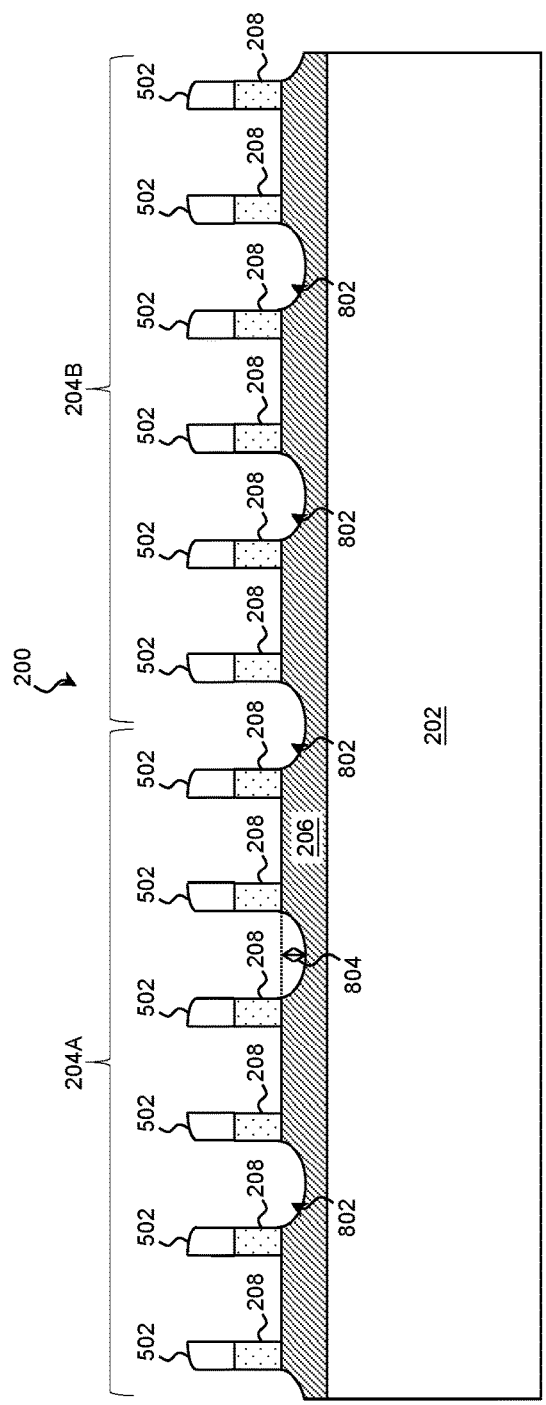

Referring to block 114 of FIG. 1A and to FIG. 8, an etching process is performed on the exposed portions of the second hard mask layer 208 to transfer the pattern of the first spacer layer 502 mandrels to the second hard mask layer 208. The etching processes may include any suitable etching technique such as wet etching, dry etching, RIE, ashing, and/or other etching techniques. In some embodiments, the etching process includes anisotropic dry etching using an oxygen-based etchant, a fluorine-based etchant, a chlorine-based etchant, a bromine-based etchant, an iodine-based etchant, other suitable etchant gases or plasmas, and/or combinations thereof.

In some examples, the etching technique is configured to create recesses 804 in the first hard mask layer 206 aligned with the recesses 604 of the second hard mask layer 208. In more detail, as the etching of the second hard mask layer 208 progresses, the recessed portions of the second hard mask layer 208 will expose the underlying first hard mask layer 206 before the remaining exposed portions of the second hard mask layer 208 have been completely removed. Thus, some etching of the first hard mask layer 206 may occur while the remaining exposed portions of the second hard mask layer 208 are being etched. Accordingly after the etching of block 114, the first hard mask layer 206 may have recesses 802 extending any suitable distance through the first hard mask layer 206, and in some examples, the recess 802 extends to a depth 804 of between about 10 Å and about 500 Å below a topmost surface of the first hard mask layer 206. In various such examples, the recess extends 802 between about 5% and about 50% through the first hard mask layer 206.

After the etching of block 114, the remainder of the first spacer layer 502 may be removed. The first spacer layer 502 may be removed using an etching technique such as wet etching, dry etching, RIE, ashing, and/or other etching technique. The etching technique may use an etchant selected to avoid significant etching of the second hard mask layer 208 or the first hard mask layer 206. Additionally or in the alternative, the first spacer layer 502 may be removed using a planarization technique such as Chemical Mechanical Polishing/Planarization (CMP) and/or other suitable removal process.

Figure 9:
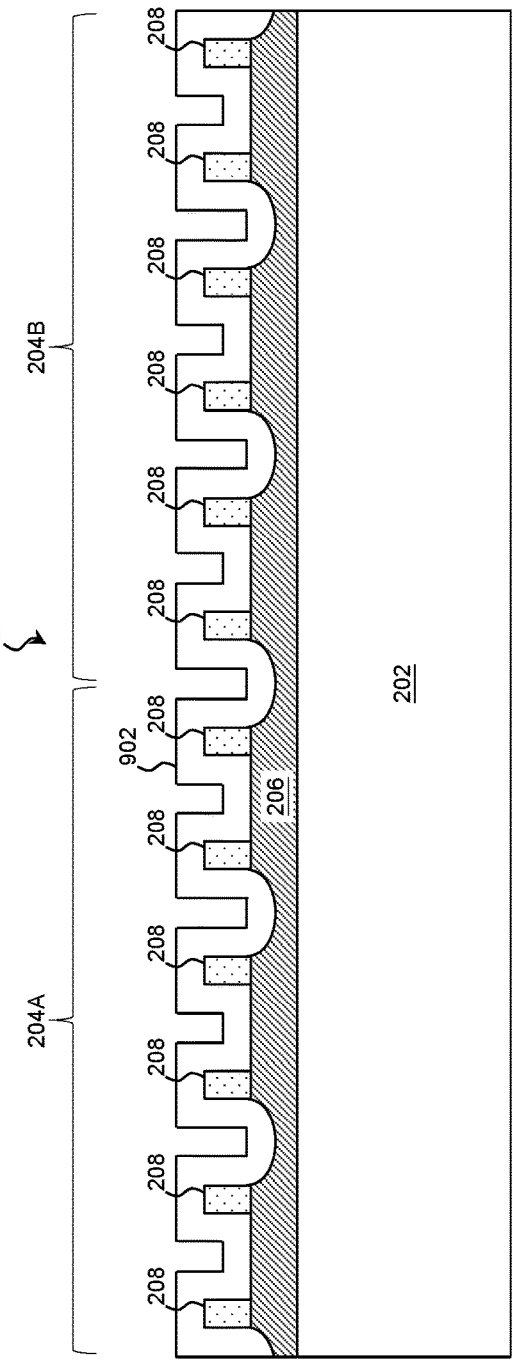

Referring to block 116 of FIG. 1A and to FIG. 9, a second spacer layer 902 is formed on the first hard mask layer 206 and on the second hard mask layer 208. This may be performed substantially as described in block 108 of FIG. 1A. The second spacer layer 902 may include any suitable material (e.g., semiconductor, semiconductor oxide, semiconductor nitride, semiconductor oxynitride, semiconductor carbide, other suitable dielectric, etc.), and may be selected to have a different etchant selectivity than the first hard mask layer 206 and the second hard mask layer 208. The second spacer layer 902 may be formed by any suitable process including CVD, HDP-CVD, ALD, PVD, and/or other suitable deposition techniques. In some such embodiments, the second spacer layer 902 is deposited conformally by CVD or ALD.

Figure 10:
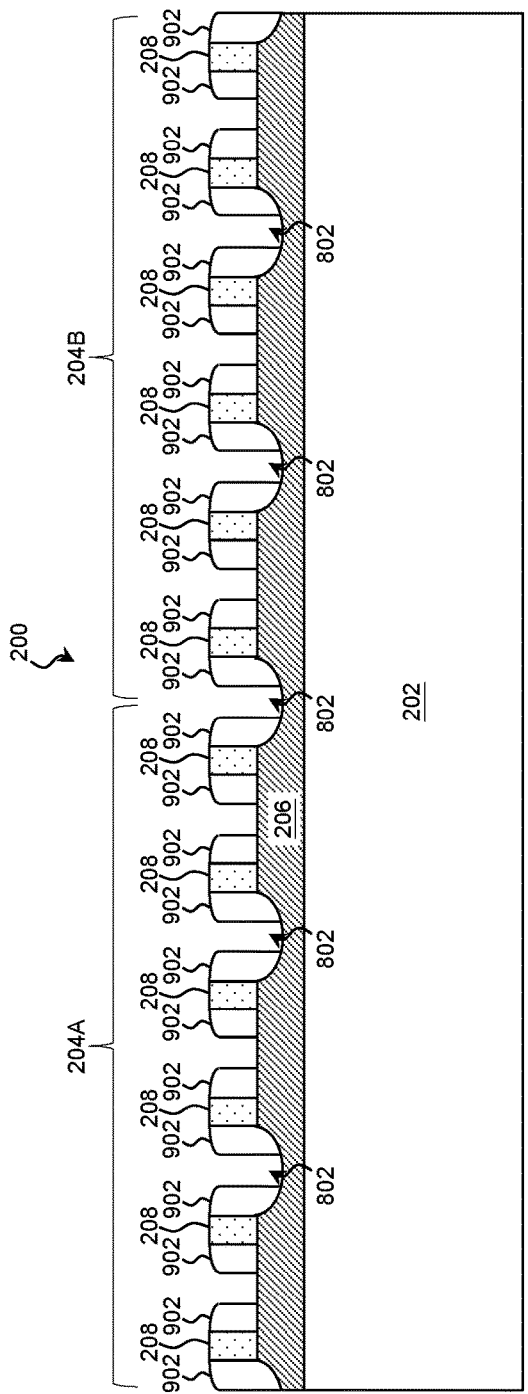

Referring to block 118 of FIG. 1A and to FIG. 10, an etching process is performed on the second spacer layer 902 to remove the second spacer layer 902 from horizontal surfaces of the second hard mask layer 208 and the third hard mask layer 210. This may be performed substantially as described in block 110 of FIG. 1A. The etching process may be performed using an anisotropic etching technique such as an anisotropic plasma etching or other suitable dry etching, wet etching, and/or RIE techniques. Portions of the second spacer layer 902 (mandrels) remain on the vertical surfaces of the second hard mask layer 208.

The etching of the second spacer layer 902 may be configured to create or extend the recesses 802 within the first hard mask layer 206 by selecting an etchant and technique capable of etching the first hard mask layer 206. The remainder of the second spacer layer 902 and the second hard mask layer 208 may protect other portions of the first hard mask layer 206. Accordingly after the etching of block 118, the recesses 802 may extend any suitable depth into the first hard mask layer 206.

Figure 11:
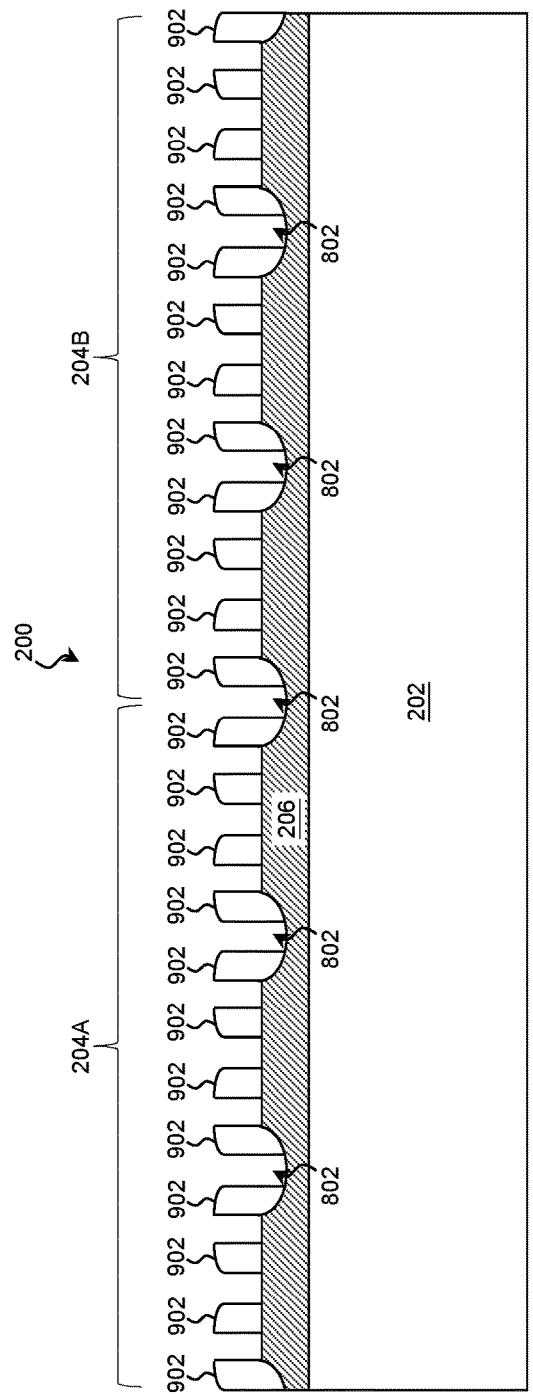

Referring to block 120 of FIG. 1A and to FIG. 11, an etching process is performed to remove the remainder of the second hard mask layer 208. This may be performed substantially as described in block 112 of FIG. 1A. The etching processes may include any suitable etching technique such as wet etching, dry etching, RIE, ashing, and/or other etching techniques. The etching process may use an etchant selected to avoid significant etching of the second spacer layer 902 and/or the first hard mask layer 206. In some examples, the etchant is configured to create or extend the recess 802 within the exposed portions of first hard mask layer 206. Accordingly after the etching of block 120, the recess 802 may extend any suitable depth into the first hard mask layer 206.

Figure 12:
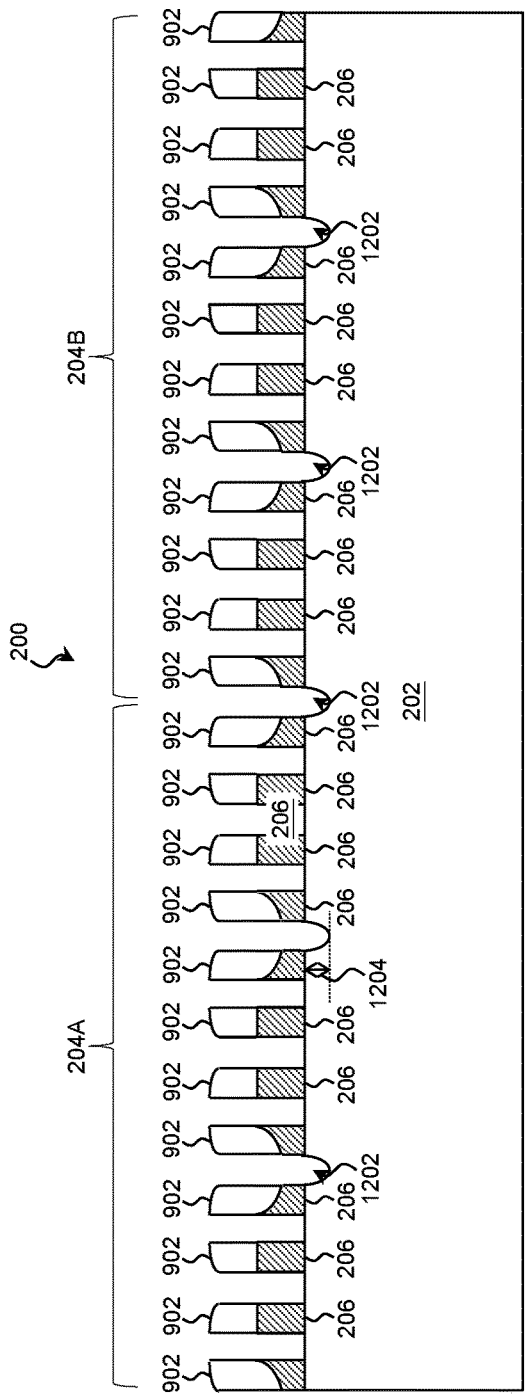

Referring to block 122 of FIG. 1A and to FIG. 12, an etching process is performed on the exposed portions of the first hard mask layer 206 to transfer the pattern of the second spacer layer 902 mandrels to the first hard mask layer 206. This may be performed substantially as described in block 114 of FIG. 1A. The etching processes may include any suitable etching technique such as wet etching, dry etching, RIE, ashing, and/or other etching techniques. In some embodiments, the etching process includes anisotropic dry etching using an oxygen-based etchant, a fluorine-based etchant, a chlorine-based etchant, a bromine-based etchant, an iodine-based etchant, other suitable etchant gases or plasmas, and/or combinations thereof. The etchant may be selected to etch the first hard mask layer 206 without significantly etching the second spacer layer 902 or the substrate 202.

In some examples, the etching of the first hard mask layer 206 is configured to create recesses 1202 within portions of the substrate 202 aligned with the recesses 802 in the first hard mask layer 206. In more detail, as the etching of the first hard mask layer 206 progresses, the recessed portions of the first hard mask layer 206 will expose the underlying substrate 202 before the remaining exposed portions of the first hard mask layer 206 have been completely removed. Thus, some etching of the substrate 202 may occur while the remaining exposed portions of the first hard mask layer 206 are being etched. Various etching parameters including duration, temperature, etchant flow, RF field power, temperature, and/or other etching parameters may be tuned to control the depth of the recesses 1202. Accordingly after the etching of block 122, the recesses 1202 may extend any suitable distance into the substrate 202, and in some examples, a recess 1202 extends to a depth 1204 of between about 10 Å and about 500 Å below a topmost surface of the substrate 202.

After the etching of block 122, the remainder of the second spacer layer 902 may be removed. The second spacer layer 902 may be removed using an etching technique such as wet etching, dry etching, RIE, ashing, and/or other etching technique. The etching technique may use an etchant selected to avoid significant etching of the first hard mask layer 206 and/or the substrate 202. Additionally or in the alternative, the second spacer layer 902 may be removed using a planarization technique such as CMP and/or other suitable removal process.

Figure 13:
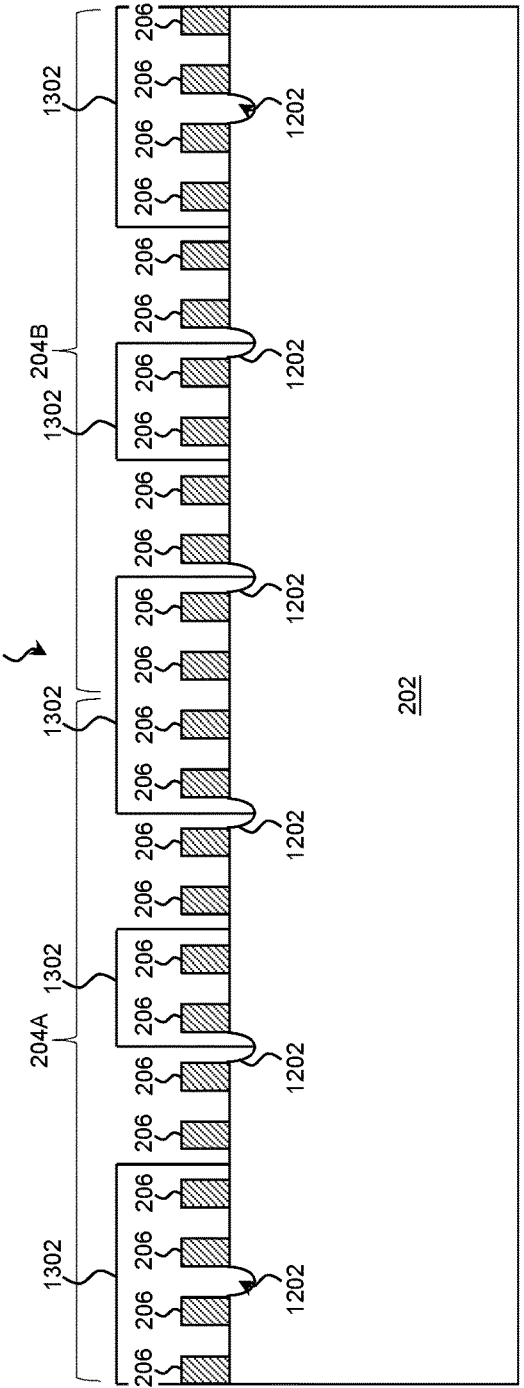

The pattern formed by the remaining portions of the first hard mask layer 206 may be used to form fins in the substrate 202. To form guard ring regions that are free of fins, some portions of the first hard mask layer 206 may be removed prior to forming the fins, thereby omitting the associated fins. In some such examples, a second photoresist 1302 is formed on the substrate 202 and on the first hard mask layer 206 and is patterned in block 124 of FIG. 1B. This may be performed substantially as described above in block 104 of FIG. 1A. As can be seen in FIG. 13, the patterned second photoresist 1302 may expose some portions of the first hard mask layer 206.

Figure 14:
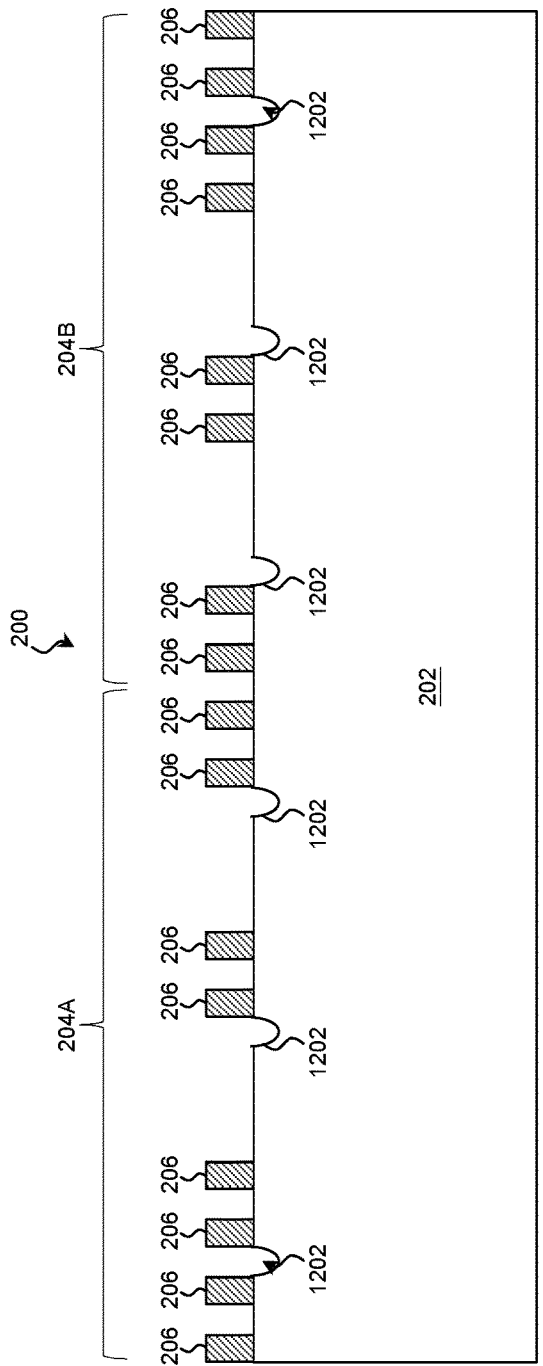

Referring to block 126 of FIG. 1B and to FIG. 14, an etching process is performed on the workpiece 200 to remove the exposed portions of the first hard mask layer 206. The etching processes may include any suitable etching technique such as wet etching, dry etching, RIE, ashing, and/or other etching techniques. In some examples, the etchant is selected to etch the first hard mask layer 206 without significantly etching the substrate 202. After etching the first hard mask layer 206 regions, the second photoresist 1302 may be removed.

Figure 15:
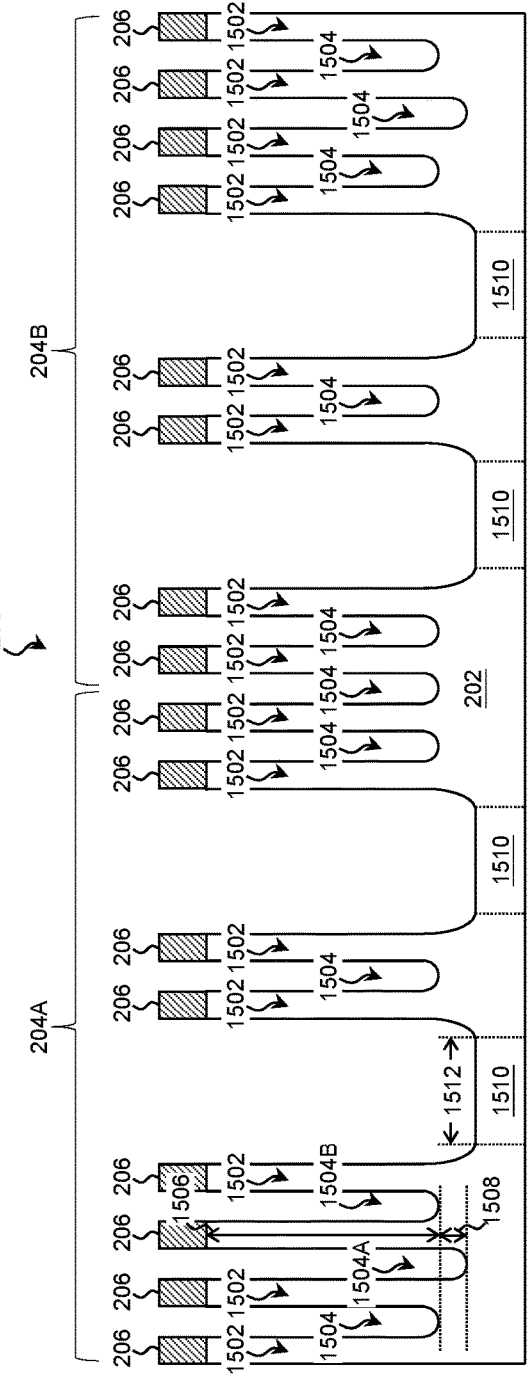

Referring to block 128 of FIG. 1B and to FIG. 15, an etching process is performed on exposed portions of the substrate 202 to define fins 1502 and trenches 1504. In some embodiments, the etching process includes anisotropic dry etching using an oxygen-based etchant, a fluorine-based etchant, a chlorine-based etchant, a bromine-based etchant, an iodine-based etchant, other suitable etchant gases or plasmas, and/or combinations thereof. The etchant may be selected to etch the substrate 202 without significantly etching the first hard mask layer 206. Various etching parameters including duration, temperature, etchant flow, RF field power, temperature, and/or other etching parameters may be tuned to control the trench depth 1506 (i.e., fin height). In various examples, the trenches 1504 extend between about 100 Å and about 1500 Å below the top of the fins 1502 as indicated by marker 1506.

As noted above, prior to the etching of block 128, recesses 1202 may be formed in the substrate 202 by the etching of block 122 and other process. As a result, the etching of block 128 may form deeper trenches 1504 in the immediately underlying portions of the substrate 202. For example, trench 1504A, which is formed by etching a portion of the substrate containing a recess 1202, is deeper than trench 1504B, which is formed by etching a portion of the substrate that does not contain a recess 1202. In various examples, the bottom of trench 1504A is between about 1 Å and about 500 Å below the bottom of trench 1504B as indicated by marker 1508. In some such examples, where the trench depth 1506 is between about 100 Å and about 2000 Å, trench 1504A is between about 5% and 20% deeper than trench 1504B. These deeper trenches 1504A may provide additional isolation for devices formed on the adjacent fins 1502, which may reduce leakage current and other parasitic effects.

As can be seen in FIG. 15, the removal of portions of the first hard mask layer 206 in block 126 prior to the fin etching of block 128 creates guard ring regions 1510 with substantially coplanar top surfaces extending through the areas 1510. In various examples, the guard ring regions 1510 are formed by omitting between about 1 and about 30 portions of the first hard mask layer 206 and accordingly the guard ring regions 1510 are between about 1 and about 30 times the fin pitch in length 1512.

Additional fins 1502 may be removed for further isolation between the corresponding features. As noted above, region 204A and region 204B of the workpiece 200 may be designated for forming devices with different performance characteristics. For example, region 204A may be designated for a higher device density, while region 204B may be designated for a lower device density but reduce leakage. In some examples, region 204A is designated for forming SRAM devices, while region 204B is designated for forming logic devices. In some examples, region 204A is designated for forming internal logic devices, and region 204B is designated for forming I/O devices. Accordingly, different techniques may be used to remove the fins 1502 in the different regions 204A and 204B.

Figure 16:
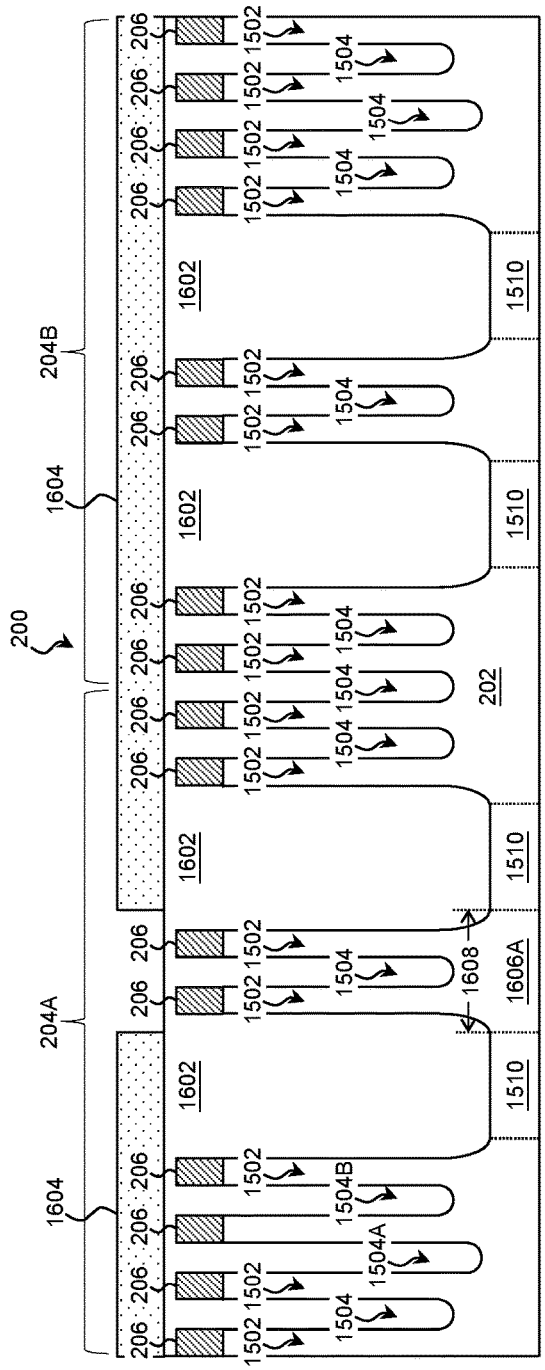

In some such examples, a fourth hard mask layer 1602 is formed on the substrate 202 and on the first hard mask layer 206 as shown in block 130 of FIG. 1B and FIG. 16. Suitable materials for the fourth hard mask layer 1602 include dielectrics, polysilicon, and/or other suitable materials, and the material of the fourth hard mask layer 1602 may be selected to have an etchant sensitivity that is different from that of the substrate 202 and the first hard mask layer 206. In some examples, the fourth hard mask layer 1602 includes a spin-on dielectric. The fourth hard mask layer 1602 may be formed by any suitable process including CVD, HDP-CVD, ALD, PVD, spin-on, and/or other suitable deposition techniques.

Referring to block 132 of FIG. 1B and referring still to FIG. 16, a third photoresist 1604 is formed on the fourth hard mask layer 1602 and patterned. This may be performed substantially as described above in blocks 104 and/or 124. The patterned third photoresist 1604 may expose some portions of the fourth hard mask layer 1602 that overly a set of fins 1502 to be removed in the first region 204A without exposing any of the fourth hard mask layer 1602 in the second region 204B. This may define a fence region 1606A of the workpiece 200. In various examples, the fence region 1606A is formed by removing between about 1 and about 30 fins 1502, and accordingly the fence region 1606A is between about 1 and about 30 times the fin pitch in length 1608.

Figure 17:
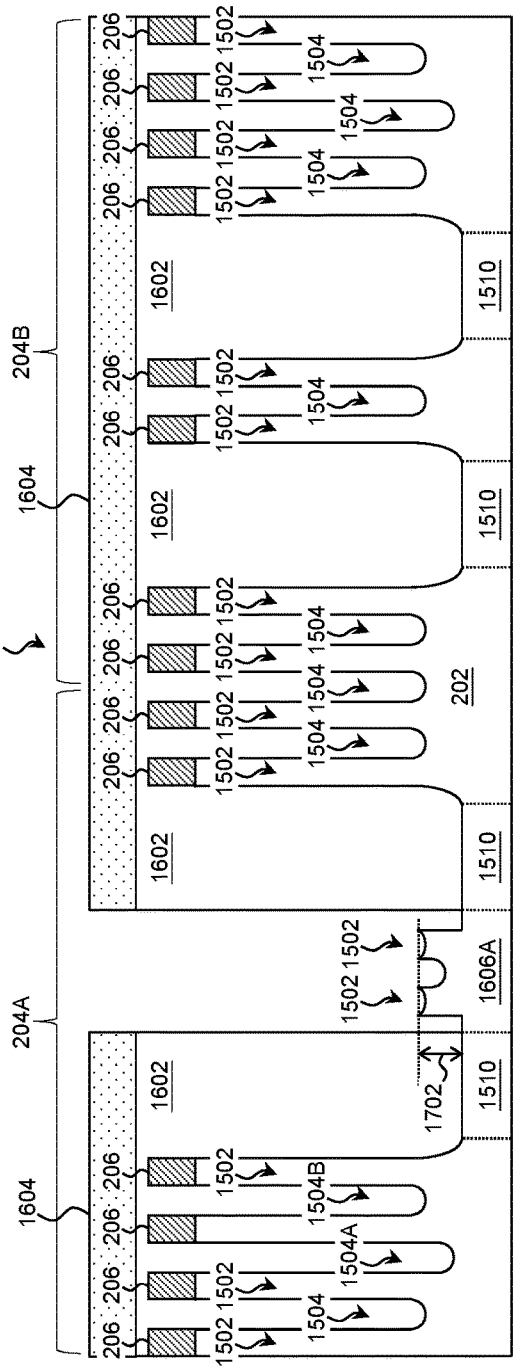

Referring to block 134 of FIG. 1B and to FIG. 17, an etching process is performed to remove the exposed portion of the fourth hard mask layer 1602 in the fence region 1606A. The etching processes may include any suitable etching technique such as wet etching, dry etching, RIE, ashing, and/or other etching techniques. In some examples, the etchant is selected to etch the fourth hard mask layer 1602 without significantly etching the substrate 202. After etching the fourth hard mask layer 1602 regions, the third photoresist 1604 may be removed.

Referring to block 136 of FIG. 1B and referring still to FIG. 17, an etching process is performed on the exposed portions of the first hard mask layer 206 and fins 1502 in the fence region 1606A. In some embodiments, the etching process includes an RIE etching process where fluorine ions and/or other ion species are directed towards the hard mask portions and fins 1502 to be etched. The ions may remove material from these features from the force of the impact (sputter etching) and/or react with the materials of the features to create a compound sensitive to a subsequent wet or dry etchant. Additionally or in the alternative, the etching process may include wet etching, dry etching, other RIE process, and/or other suitable etching techniques using an oxygen-based etchant, a fluorine-based etchant, a chlorine-based etchant, a bromine-based etchant, an iodine-based etchant, other suitable etchant gases or plasmas, and/or combinations thereof.

In some examples, the duration, temperature, etchant flow, RF field power, temperature, and/or other etching parameters are controlled so that some portion of the fins 1502 remain in the fence region 1606A. In various such examples, the remaining fins 1502 in the fence region 1606A extend between about 1 Å and about 500 Å above a topmost surface of the substrate 202 in the adjacent guard ring regions 1510 as indicated by marker 1702, and the entirety of the topmost surface of the substrate 202 in the fence region 1606A remains at or above the topmost surface in the guard ring regions 1510.

While thermal processes performed on the workpiece 200 may impart forces on the substrate 202 that tend to cause fins 1502 outside the fence region 1606A to bow or bend, it has been determined that leaving fins 1502 within the fence region 1606A as described above tend to reduce thermal bending produced in response to these forces. As thermal bending may affect regions with particular attributes (e.g., higher device/fin density) more than others, the etching of block 136 may be performed on the first region 204A of the workpiece 200 based on characteristics of the devices to be formed therein without performing the etching on the second region 204B based on the characteristics of the devices to be formed in the first region 204B.

The fourth hard mask layer 1602 may be removed following the etching of block 136.

Figure 18:
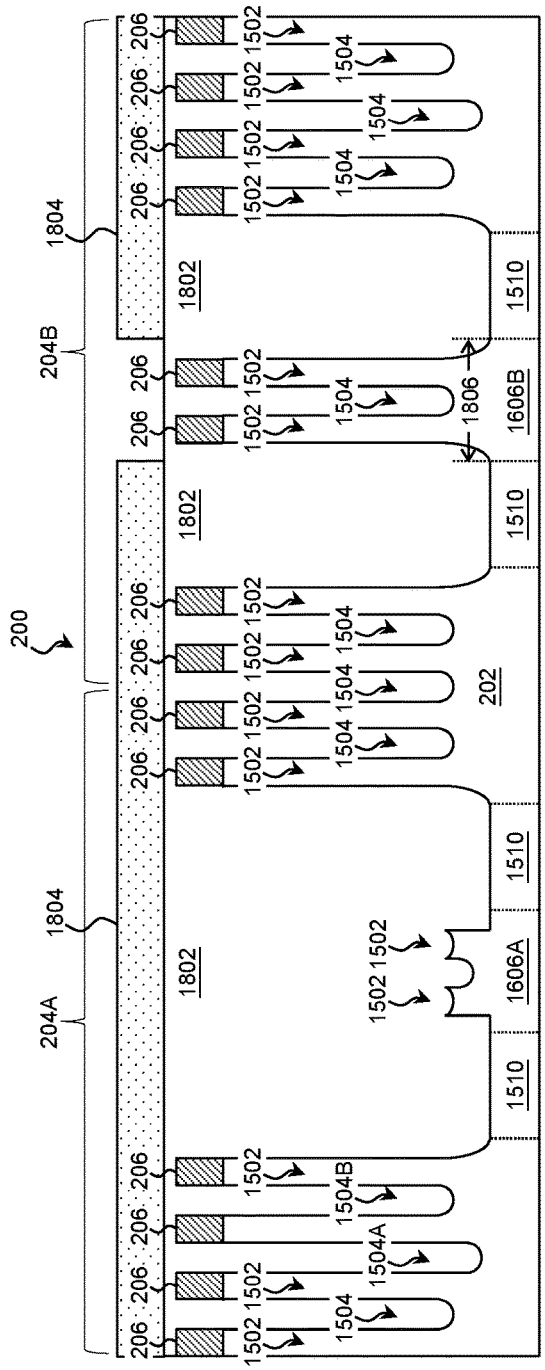

Referring to block 138 of FIG. 1B and to FIG. 18, a fifth hard mask layer 1802 is formed on the substrate 202 and on the first hard mask layer 206. This may be performed substantially as described above in block 130. Suitable materials for the fifth hard mask layer 1802 include dielectrics, polysilicon, and/or other suitable materials, and the material of the fifth hard mask layer 1802 may be selected to have an etchant sensitivity that is different from that of the substrate 202 and the first hard mask layer 206. In some examples, the fifth hard mask layer 1802 includes a spin-on dielectric. The fifth hard mask layer 1802 may be formed by any suitable process including CVD, HDP-CVD, ALD, PVD, spin-on, and/or other suitable deposition techniques.

Referring to block 140 of FIG. 1B and referring still to FIG. 18, a fourth photoresist 1804 is formed on the fifth hard mask layer 1802 and patterned. This may be performed substantially as described above in blocks 124 and/or 132. The patterned fourth photoresist 1804 may expose some portions of the fifth hard mask layer 1802 that overly a set of fins 1502 to be removed in the second region 204B without exposing any of the fifth hard mask layer 1802 in the first region. This may define a second fence region 1606B on the workpiece 200. In various examples, the second fence region 1606B is formed by removing between about 1 and about 30 fins 1502, and accordingly the fence region 1606B is between about 1 and about 30 times the fin pitch in length 1806.

Figure 19:
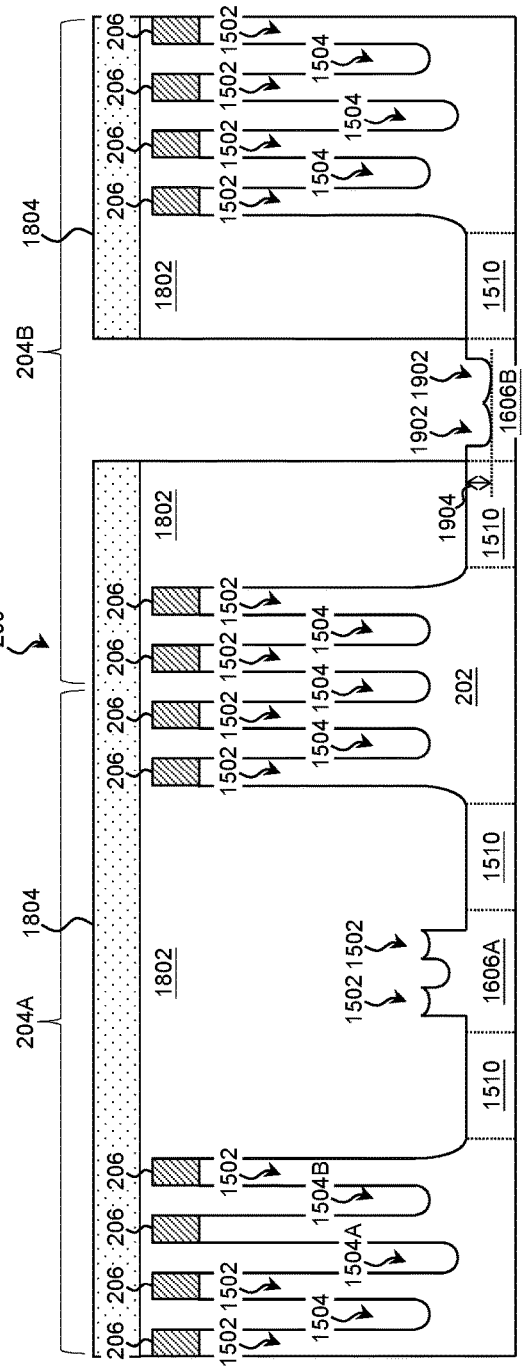
Figure 20:
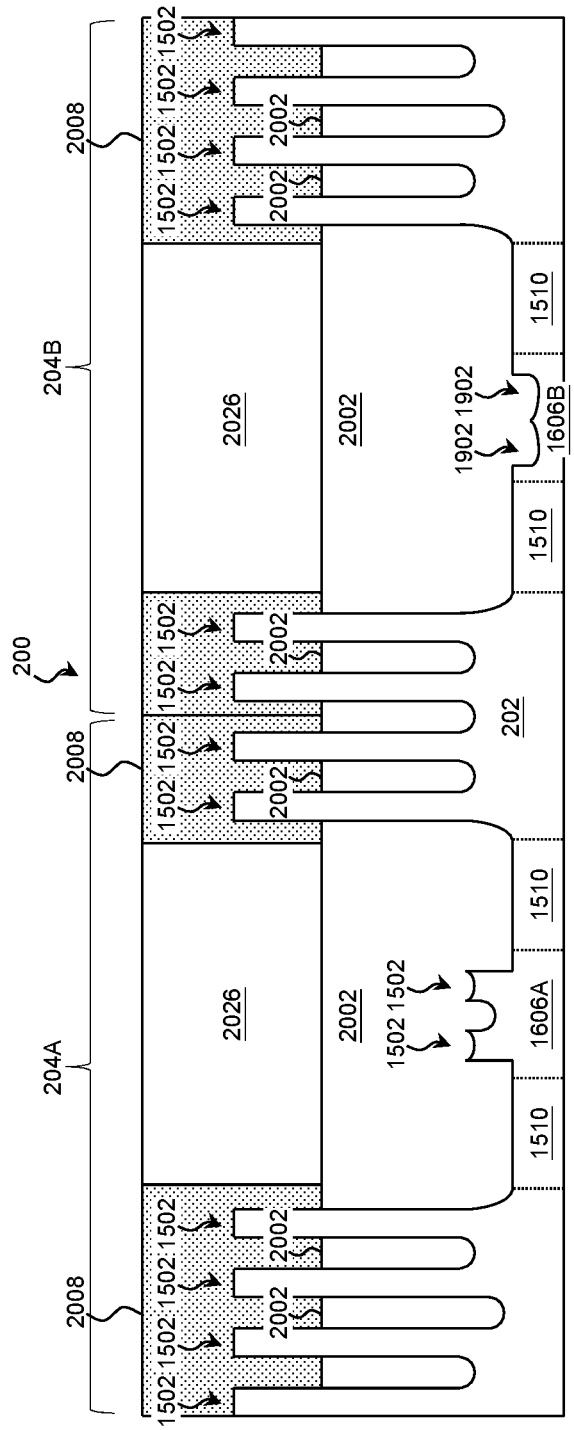

Referring to block 142 of FIG. 1B and to FIG. 19, an etching process is performed to remove the exposed portion of the fifth hard mask layer 1802 in the fence region 1606B. This may be performed substantially as described in block 134. The etching processes may include any suitable etching technique such as wet etching, dry etching, RIE, ashing, and/or other etching techniques. In some examples, the etchant is selected to etch the fifth hard mask layer 1802 without significantly etching the substrate 202. After etching the fifth hard mask layer 1802 regions, the fourth photoresist 1804 may be removed.

Referring to block 144 of FIG. 1B and referring still to FIG. 19, an etching process is performed on the exposed portions of the first hard mask layer 206 and fins 1502 in the fence region 1606B. In some embodiments, the etching process includes an RIE etching process where fluorine ions and/or other ion species are directed towards the hard mask portions and fins 1502 to be etched. The ions may remove material from these features via sputter etching and/or react with the materials of the features to create a compound sensitive to a subsequent wet or dry etchant. Additionally or in the alternative, the etching process may include wet etching, dry etching, other RIE process, and/or other suitable etching techniques using an oxygen-based etchant, a fluorine-based etchant, a chlorine-based etchant, a bromine-based etchant, an iodine-based etchant, other suitable etchant gases or plasmas, and/or combinations thereof.

In some examples, the duration, temperature, etchant flow, RF field power, temperature, and/or etching parameters are controlled so that the entirety of the top surface of the fence region 1606B is at or below the top surface of the adjacent guard ring regions 1510. In various such examples, this forms recesses 1902 within the fence region 1606B that extend between about 1 Å and about 500 Å below a topmost surface of the substrate 202 in the guard ring regions 1510 as indicated by marker 1904, and the peaks of the topmost surface of the substrate 202 within the fence region 1606B remain at or below the topmost surface in the guard ring regions 1510. It has been determined that this configuration may reduce leakage current as compared to fence region 1606A, particularly in devices with high drive strength. Accordingly, the etching of block 144 may be performed on the second region 204B without performing the etching on the first region 204A based on the characteristics of the devices to be formed in the second region 204B.

The fifth hard mask layer 1802 may be removed following the etching of block 144.

With the fins formed, the workpiece 200 may be provided for forming active and passive devices thereupon as shown in block 146 of FIG. 1A and FIGS. 20, 21A and 21B. In some examples, isolation features 2002, such as Shallow Trench Isolation features (STIs), are formed on the workpiece 200 by depositing one or more dielectric materials such as semiconductor oxides, semiconductor nitrides, semiconductor carbides, FluoroSilicate Glass (FSG), low-K dielectric materials, and/or other suitable dielectric materials in the trenches 1504 between the fins 1502.

In some examples, a transistor (e.g., FinFET) is formed on a fin 1502 by a forming pair of opposing source/drain features 2004 separated by a channel region 2006. The source/drain features 2004 may include a semiconductor (e.g., Si, Ge, SiGe, etc.) and one or more dopants, such as p-type dopants (e.g., boron or $BF_2$) or n-type dopants (e.g., phosphorus or arsenic). Similarly, the channel region 2006 may include a semiconductor and one or more dopants of the opposite type of those of the source/drain features 2004.

In some examples, a gate stack 2008 is formed adjacent to and overwrapping the channel region 2006 to control the flow of carriers (electrons for an n-channel FinFET and holes for a p-channel FinFET) through the channel region 2006. The gate stack 2008 may include an interfacial layer 2010, such as a dielectric (e.g., a semiconductor oxide, a semiconductor nitride, a semiconductor oxynitride, a semiconductor carbide, a semiconductor carboxynitride, etc.) or other suitable material. The interfacial layer 2010 may be formed by chemical oxidation, thermal oxidation, CVD, ALD, and/or other suitable techniques. Accordingly, in some embodiments, the interfacial layer 2010 includes silicon oxide and/or silicon-germanium oxide formed by thermal oxidation.

The gate stack 2008 may include a gate dielectric layer 2012 formed on the interfacial layer 2010. The gate dielectric layer 2012 may cover the interfacial layer 2010 and may extend vertically along a set of dielectric gate spacers 2014. Suitable materials for the gate dielectric layer 2012 are commonly characterized by their dielectric constant (k) relative to silicon oxide. The gate dielectric layer 2012 may include a high-k dielectric material such as $HfO_2$, HfSiO, HfSiON, HfTaO, HfTiO, HfZrO, zirconium oxide ($ZrO_2$), lanthanum oxide ($La_2O_3$), titanium oxide ($TiO_2$), yttrium oxide ($Y_2O_3$), strontium titanate ($SrTiO_3$), aluminum oxide, hafnium dioxide-alumina ($HfO_2$—$Al_2O_3$) alloy, other suitable high-k dielectric materials, and/or combinations thereof.

The gate stack 2008 may include a gate electrode disposed on the gate dielectric layer 2012. In some examples, the gate electrode includes a plurality of conductive layers such as a capping layer 2016, a barrier layer 2018, work function layer(s) 2020, a glue layer 2022, and an electrode fill 2024.

In various such examples, the capping layer 2016 contains a suitable material such as TaSiN, TaN, TiN, and/or combinations thereof; the barrier layer 2018 contains a suitable material, such as W, Ti, TiN, Ru, and/or combinations thereof; p-type work function layer(s) 2020 include a suitable p-type work function material, such as TiN, TaN, Ru, Mo, Al, WN, $ZrSi_2$, $MoSi_2$, $TaSi_2$, $NiSi_2$, WN, and/or combinations thereof; n-type work function layer(s) 2020 include a suitable n-type work function material, such as Ti, Ag, TaAl, TaAlC, TiAlN, TaC, TaCN, TaSiN, Mn, Zr, and/or combinations thereof; the glue layer 2022 includes a metal (e.g., W, Al, Ta, Ti, Ni, Cu, Co, etc.), a metal oxide, a metal nitride, and/or combinations thereof; and the electrode fill 2024 includes a metal (e.g., W, Al, Ta, Ti, Ni, Cu, Co, etc.), a metal oxide, a metal nitride, and/or combinations thereof.

The workpiece 200 may include an Inter-Level Dielectric (ILD) layer 2026 disposed on the workpiece 200. The ILD layer 2026 acts as an insulator that supports and isolates conductive traces of an electrical multi-level interconnect structure that electrically interconnects elements of the workpiece 200, such as the source/drain features 2004 and the gate stack 2006. The ILD layer 2026 may comprise a dielectric material (e.g., a semiconductor oxide, a semiconductor nitride, a semiconductor oxynitride, a semiconductor carbide, etc.), Spin On Glass (SOG), FSG, phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. The ILD layer 2026 may be formed by any suitable process including CVD, PVD, spin-on deposition, and/or other suitable processes.

Thus, the present disclosure provides examples of an integrated circuit with a fin-based devices and a method for forming the integrated circuit. In some examples, a method includes receiving a substrate that includes: a plurality of fins extending above a remainder of the substrate; a first region that includes a first fence region that contains a first subset of the plurality of fins; and a second region that includes a second fence region that contains a second subset of the plurality of fins. The first region has a first performance characteristic, and the second region has a second performance characteristic that is different from the first. Based on the first performance characteristic, the first subset of the plurality of fins is recessed to a first height, and based on the second performance characteristic, the second subset of the plurality of fins is recessed to a second height that is less than the first height. In some such examples, the first region of the substrate further includes a first guard ring region that is free of fins, and each fin of the first subset extends above a top surface of the substrate in the first guard ring region. In some such examples, each fin of the first subset extends between about 1 Å and about 500 Å above the top surface of the substrate in the first guard ring region. In some such examples, an entirety of the top surface of the substrate in the first fence region is at or above the top surface of the substrate in the first guard ring region. In some such examples, the second region of the substrate further includes a second guard ring region that is free of fins, and each fin of the second subset is recessed below the top surface of the substrate in the second guard ring region. In some such examples, each fin of the second subset is between about 1 Å and about 500 Å below the top surface of the substrate in the second guard ring region. In some such examples, an entirety of the top surface of the substrate in the second fence region is at or below the top surface of the substrate in the second guard ring region. In some such examples, a first isolation feature is formed on the first guard ring region and the first subset of the plurality of fins and a second isolation feature is formed on the second guard ring region and the second subset of the plurality of fins. In some such examples, circuit devices are formed on the plurality of fins within the first region and the second region. The first performance characteristic includes a first device density and the second performance characteristic includes a second device density. In some such examples, circuit devices are formed on the plurality of fins within the first region and the second region. The recessing of the first subset of the plurality of fins is based on forming SRAM devices in the first region, and the recessing of the second subset of the plurality of fins is based on forming logic devices in the second region.

In further examples, a method includes receiving a workpiece that includes: a substrate; a hard mask layer disposed on the substrate; and a patterned layer disposed on the hard mask layer such that the patterned layer exposes a first portion and a second portion of the hard mask layer. The first portion and the second portion of the hard mask layer are etched such that the etching etches a first portion of the substrate underlying the first portion of the hard mask layer without significantly etching a second portion of the substrate underlying the second portion of the hard mask layer. The substrate is etched to define a plurality of fins such that a first trench adjacent a fin of the plurality of fins extends to a depth that is greater than a depth of a second trench adjacent the fin. In some such examples, a transistor is formed on the fin. In some such examples, the hard mask layer is recessed such that a top surface of the first portion of the hard mask layer is below a top surface of the second portion of the hard mask layer. In some such examples, isolation features are formed within the first trench and the second trench. In some such examples, the etching of the substrate forms a first guard ring region in a first region of the workpiece, and a first subset of the plurality of fins within a first fence region adjacent the first guard ring region are selectively recessed to be below a remainder of the plurality of fins. Each fin in the first subset extends above a top surface of the substrate within the first guard ring region. In some such examples, the etching of the substrate forms a second guard ring region in a second region of the workpiece, and a second subset of the plurality of fins within a second fence region adjacent the second guard ring region are selectively recessed to be below the top surface of the substrate within the second guard ring region. An entirety of the top surface of the substrate within the second fence region is at or above the top surface of the substrate within the second guard ring region.

In yet further examples, an integrated circuit includes a substrate that includes: a plurality of fins that extend above a remainder of the substrate; a first region that has a first guard ring region that is free of fins and a first fence region disposed adjacent the first guard ring region; and a second region that has a second guard ring region that is free of fins and a second fence region disposed adjacent the second guard ring region, wherein a topmost surface of the substrate within the first fence region extends above the topmost surface of the substrate in the second fence region. In some such examples, the first fence region includes a first subset of the plurality of fins, each fin of the first subset is below a remainder of the plurality of fins, and each fin of the first subset extends above the topmost surface of the substrate within the first guard ring region. In some such examples, a portion of the topmost surface of the substrate within the second fence region is below the topmost surface of the substrate within the second guard ring region, and an entirety of the topmost surface of the substrate within the second fence region is at or below the topmost surface of the substrate within the second guard ring region. In some such examples, a first trench adjacent a fin of the plurality of fins extends to a depth that is greater than a depth of a second trench adjacent the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first set of fins and a second set of fins extending above a substrate, wherein the substrate includes:

a first fence region that contains the first set of fins;
a first guard ring region that is free of fins and interfacing with a first side of the first fence region, and wherein each fin of the first set of fins extends above a top surface of the substrate in the first guard ring region;
a second guard ring region that is free of fins and interfacing with a second side of the first fence region that is opposite the first side of the first fence region; and
a gate dielectric layer disposed over the second set of fins; and
a gate electrode layer disposed over the gate dielectric layer.

2. The device of claim 1, further comprising a shallow trench isolation structure disposed directly on the first fence region of the substrate, the first guard ring region of the substrate and the second guard ring region of the substrate.

3. The device of claim 2, wherein the first set of fins are completely embedded in the shallow trench isolation structure such that a topmost surface of the first set of fins are covered by the shallow trench isolation structure.

4. The device of claim 1, further comprising a shallow trench isolation structure disposed between each fin from the second set of fins,
wherein the second set of fins includes a first fin, a second fin and third fin, and
wherein the shallow trench isolation structure extends to a greater depth between the first and second fins than the second and third fins.

5. The device of claim 1, wherein each fin of the first set of fins extends between about 1 Å and about 500 Å above the top surface of the substrate in the first guard ring region.

6. The device of claim 1, wherein an entirety of the top surface of the substrate in the first fence region is at or above the top surface of the substrate in the first guard ring region.

7. The device of claim 1, wherein the substrate further includes a second fence region interfacing with a third guard ring region that is free of any fins, and wherein an entirety of the top surface of the substrate in the second fence region is at or below a top surface of the substrate in the third guard ring region.

8. A device comprising:
a first set of fins disposed over a first region of the substrate;
a first gate structure disposed over the first set of fins;
a first fence region that includes a second set of fins disposed over a second region of the substrate;
a first guard ring region that is free of fins disposed over the second region of the substrate, wherein at least one fin of the second set of fins extends above a top surface of the substrate in the first guard ring region;
a second fence region disposed over a third region of the substrate;
a second guard ring region that is free of fins disposed over the third region of the substrate, wherein an entirety of the top surface of the substrate in the second fence region is at or below a top surface of the substrate in the second guard ring region.

9. The device of claim 8, wherein the top surface of the substrate in the second fence region includes a portion that is below the top surface of the substrate in the second guard ring region.

10. The device of claim 8, further comprising a shallow trench isolation structure disposed over the first, second and third regions of the substrate,
wherein a first portion of the shallow trench isolation structure physically contacts the second set of fins, and
wherein a second portion of the shallow trench isolation structure physically contacts the top surface of the substrate in the second guard ring region.

11. The device of claim 8, wherein the first portion of the shallow trench isolation structure extends from one of the fins from the first set of fins to one of the fins from the second set of fins.

12. The device of claim 11, wherein a top surface of the one of the fins from the second set of fins is covered by the first portion of the shallow trench isolation structure.

13. The device of claim 8, wherein each fin of the second set of fins extends to a greater height than the top surface of the substrate in the second guard ring region.

14. The device of claim 8, further comprising:
a third set of fins disposed over a fourth region of the substrate, wherein the fourth region of the substrate is disposed between the second region of the substrate and the third region of the substrate, and
a second gate structure disposed over the third set of fins.

15. The device of claim 14, wherein the second region of the substrate is free of any gate structure.

16. The device of claim 8, wherein the first gate structure includes:
a gate dielectric disposed over the first set of fins;
a capping layer disposed over the gate dielectric layer;
a barrier layer disposed over the capping layer;
a work function layer disposed over the barrier layer; and
a fill layer disposed over the work function layer.

17. An integrated circuit comprising:
a substrate that includes:
a plurality of fins that extend above a remainder of the substrate;
a first region that has a first guard ring region that is free of fins and a first fence region disposed adjacent the first guard ring region; and
a second region that has a second guard ring region that is free of fins and a second fence region disposed adjacent the second guard ring region, wherein a topmost surface of the substrate within the first fence region extends above the topmost surface of the substrate in the second fence region.

18. The integrated circuit of claim 17, wherein:
the first fence region includes a first subset of the plurality of fins;
each fin of the first subset is below a remainder of the plurality of fins; and
each fin of the first subset extends above the topmost surface of the substrate within the first guard ring region.

19. The integrated circuit of claim 17, wherein:
a portion of the topmost surface of the substrate within the second fence region is below the topmost surface of the substrate within the second guard ring region; and
an entirety of the topmost surface of the substrate within the second fence region is at or below the topmost surface of the substrate within the second guard ring region.

20. The integrated circuit of claim 17, wherein a first trench adjacent a fin of the plurality of fins extends to a depth that is greater than a depth of a second trench adjacent the fin.

* * * * *